(12) United States Patent
Kim et al.

(10) Patent No.: US 10,825,896 B2
(45) Date of Patent: Nov. 3, 2020

(54) SILICON CARBIDE-BASED TRANSISTOR AND METHOD FOR MANUFACTURING THE SAME

(71) Applicant: SOGANG UNIVERSITY RESEARCH FOUNDATION, Seoul (KR)

(72) Inventors: Kwang Soo Kim, Goyang-si (KR); Dong Woo Bae, Seoul (KR)

(73) Assignee: SOGANG UNIVERSITY RESEARCH FOUNDATION, Seoul (KR)

(*) Notice: Subject to any disclaimer, the term of this patent is extended or adjusted under 35 U.S.C. 154(b) by 0 days.

(21) Appl. No.: 16/329,385

(22) PCT Filed: Oct. 12, 2017

(86) PCT No.: PCT/KR2017/011260
§ 371 (c)(1),
(2) Date: Feb. 28, 2019

(87) PCT Pub. No.: WO2018/070808
PCT Pub. Date: Apr. 19, 2018

(65) Prior Publication Data
US 2019/0198608 A1    Jun. 27, 2019

(30) Foreign Application Priority Data
Oct. 14, 2016    (KR) .................. 10-2016-0133720

(51) Int. Cl.
*H01L 21/761*    (2006.01)
*H01L 29/06*    (2006.01)
(Continued)

(52) U.S. Cl.
CPC ........ *H01L 29/0626* (2013.01); *H01L 21/046* (2013.01); *H01L 21/74* (2013.01);
(Continued)

(58) Field of Classification Search
CPC ..... H01L 29/1608; H01L 27/092–0928; H01L 21/7605; H01L 21/7607;
(Continued)

(56) References Cited

U.S. PATENT DOCUMENTS 4,277,291 A * 7/1981 Cerofolini ........... H01L 29/0638
                                                                438/227
4,829,359 A * 5/1989 O ........................ H01L 27/0927
                                                                257/372
(Continued)

FOREIGN PATENT DOCUMENTS

KR    10-1998-0078231 A    11/1998
KR    10-1999-0027706 A    4/1999
(Continued)

OTHER PUBLICATIONS

International Search Report for PCT/KR2017/011260 dated Feb. 2, 2018 from Korean Intellectual Property Office.

*Primary Examiner* — Eric A. Ward
(74) *Attorney, Agent, or Firm* — Paratus Law Group, PLLC

(57) ABSTRACT

Disclosed is a transistor including a substrate, first and second type wells in contact with each other on the substrate; and a breakdown voltage improving region including vertical high concentration doped regions according to first and second types vertically in contact from upper surfaces of the first and second type wells to an upper surface of the substrate in a portion where the first and second type wells are in contact with each other.

16 Claims, 6 Drawing Sheets

(51) Int. Cl.
*H01L 27/092* (2006.01)
*H01L 29/16* (2006.01)
*H01L 21/04* (2006.01)
*H01L 21/82* (2006.01)
*H01L 21/74* (2006.01)
*H01L 29/10* (2006.01)
*H01L 29/24* (2006.01)
*H01L 21/8238* (2006.01)

(52) U.S. Cl.
CPC .. *H01L 21/8213* (2013.01); *H01L 21/823878* (2013.01); *H01L 27/092* (2013.01); *H01L 27/0928* (2013.01); *H01L 29/1083* (2013.01); *H01L 29/16* (2013.01); *H01L 29/1608* (2013.01); *H01L 29/24* (2013.01); *H01L 21/823892* (2013.01)

(58) Field of Classification Search
CPC ....... H01L 21/762–765; H01L 21/7602; H01L 21/761; H01L 21/8213; H01L 21/8238–823892

See application file for complete search history.

(56) References Cited

U.S. PATENT DOCUMENTS

| | | | | |
|---|---|---|---|---|
| 5,138,420 | A * | 8/1992 | Komori | H01L 27/0928 257/371 |
| 5,831,313 | A * | 11/1998 | Han | H01L 21/76218 257/371 |
| 5,981,326 | A * | 11/1999 | Wanlass | H01L 21/761 148/DIG. 1 |
| 6,362,080 | B1 * | 3/2002 | Hopper | H01L 21/761 257/E21.544 |
| 6,791,147 | B1 * | 9/2004 | Karasawa | H01L 21/823892 257/371 |
| 2004/0012068 | A1 * | 1/2004 | Iwata | H01L 21/761 257/506 |
| 2008/0210980 | A1 | 9/2008 | Disney et al. | |
| 2012/0112291 | A1 * | 5/2012 | Yanagi | H01L 21/761 257/369 |
| 2013/0270636 | A1 | 10/2013 | Ito | |
| 2013/0277745 | A1 * | 10/2013 | Tsai | H01L 27/0259 257/355 |
| 2016/0268220 | A1 * | 9/2016 | Tsai | H01L 27/14621 |

FOREIGN PATENT DOCUMENTS

| KR | 10-0209222 B1 | 7/1999 |
| KR | 10-0393399 B1 | 7/2003 |
| KR | 10-0698096 B1 | 3/2007 |

* cited by examiner

SILICON CARBIDE-BASED TRANSISTOR AND METHOD FOR MANUFACTURING THE SAME

CROSS REFERENCE TO PRIOR APPLICATIONS

This application is a National Stage Patent Application of PCT International Patent Application No. PCT/KR2017/011260 (filed on Oct. 12, 2017) under 35 U.S.C. § 371, which claims priority to Korean Patent Application No. 10-2016-0133720 (filed on Oct. 14, 2016), which are all hereby incorporated by reference in their entirety.

BACKGROUND

The present invention relates to a silicon carbide-based transistor technology, and more particularly to, a silicon carbide-based transistor in which the occurrence of reach-through is structurally prevented to improve a breakdown voltage and decrease a leakage current, and a method for manufacturing the same.

Complementary metal-oxide semiconductor (CMOS), having good power consumption characteristics, is commonly used as an inverter structure. While most metal-oxide semiconductor (MOS) invertors have a standby current generated in a 'HIGH' or 'LOW state, a CMOS inverter has very good characteristics of standby power consumption because a very low standby current is generated as one side transistor therein is turned off.

CMOS using silicon is weak to high temperatures and high pressure, having limitations for use as a high efficiency inverter for power conversion of renewable energy and in electric vehicles. Also, in configuring a power conversion device, the CMOS using silicon occupies a large space in the process of connecting elements in series and in parallel and an auxiliary device such as a cooling device for heat dissipation, having many disadvantages in terms of light weight and miniaturization.

To overcome these problems, silicon carbide (SiC)-based power devices have been developed. SiC has wide bandgap properties and advantageously stably operate even at high temperatures.

The related art SiC CMOS has a higher breakdown voltage than a silicon-based CMOS in terms of an avalanche breakdown. However, if a depletion region is formed to be greater than a cell pitch before the avalanche breakdown occurs, breakdown still occurs due to reach-through. Due to the breakdown resulting from reach-through, the related art SiC CMOS cannot withstand a high voltage so the breakdown voltage is lowered.

Korean Patent Registration No. 10-0393399 relates to a method of manufacturing a silicon carbide power device including; masking a surface of a silicon carbide substrate to define an opening at the surface (112); implanting a p-type dopant into the silicon carbide substrate through the opening at implantation energy and dosage to form a deep p-type implanted portion (116); implanting an n-type dopant into the silicon carbide substrate through the opening at implantation energy and dosage to form a shallow n-type implanted portion 124a, relative to the deep p-type implanted portion (122); and heat-treating the deep p-type implanted portion and the shallow n-type implanted portion at a temperature of 1650° C. or lower.

Korean Patent Registration No. 10-0698096 relates to an ESD protecting circuit and manufacturing method thereof including; an isolation layer formed in a field region of a first conductivity-type semiconductor substrate; first and second high-concentration second conductivity-type impurity regions formed on the first conductivity-type semiconductor substrate and isolated by the isolation layer; a high-concentration first conductivity-type impurity region formed on the first conductivity-type semiconductor substrate on one side of the second high-concentration second conductivity-type impurity region and isolated by the isolation layer; a first conductivity-type well formed below partial regions of the high-concentration first conductivity-type impurity region, the second high-concentration second conductivity-type impurity region and the first high-concentration second conductivity-type impurity region in the semiconductor substrate; a second conductivity-type well formed at the other remaining regions the first high-concentration second conductivity-type impurity region on one side of the first conductivity-type well in the semiconductor substrate; and a first conductivity-type impurity region formed at an interface portion between the first and second conductivity-type wells below the first high-concentration second conductivity-type impurity region to lower a breakdown voltage.

SUMMARY

An embodiment of the present invention provides a silicon carbide-based transistor in which the occurrence of reach-through is structurally prevented to improve a breakdown voltage and decrease a leakage current, and a method for manufacturing the same.

An embodiment of the present invention provides a silicon carbide-based transistor in which a breakdown voltage is enhanced in consideration of both a breakdown voltage due to reach-through and an avalanche breakdown voltage through vertical high-concentration doped regions each having a different doping concentration, while maintaining other switch characteristics, and a method for manufacturing the same.

An embodiment of the present invention provides a silicon carbide-based transistor capable of ensuring operational stability of complementary metal-oxide semiconductor (CMOS) at high temperatures, while supporting a high breakdown voltage, and a method for manufacturing the same.

In an embodiment, a transistor includes a substrate, first and second type wells in contact with each other on the substrate; and a breakdown voltage improving region including vertical high concentration doped regions according to first and second types vertically in contact from upper surfaces of the first and second type wells to an upper surface of the substrate in a portion where the first and second type wells are in contact with each other.

The breakdown voltage improving region may include a border region at the mutually contact region, and the border region is overlapped by the vertical high concentration doped regions according to the first and second types, forms an interface, or is underlapped.

The border region of the breakdown voltage improving region may be formed such that $\Delta W_{BS}$ defined as a percentage of a width of the border region to the sum of widths of the vertical high concentration doped regions has an allowable range of $-5(\%) \leq \Delta W_{BS}(\%) \leq +7(\%)$, wherein the negative value indicates the overlapping and the positive value indicates the underlapping.

The vertical high concentration doped regions of the breakdown voltage improving region may be formed to be symmetrical.

The vertical high concentration doped regions of the breakdown voltage improving region may have a doping concentration higher than a doping concentration of each of the first and second type wells and lower than a doping concentration of source and drain doped regions formed in portions of each of the first and second type wells.

Each of the vertical high concentration doped regions may include a plurality of vertical high concentration doped subregions each having a different doping concentration.

Each of the vertical high concentration doped regions may include a plurality of vertical high concentration doped subregions, having doping concentrations decreased away from an interface between the vertical high concentration doped regions.

Each of the vertical high concentration doped regions may include a first vertical high concentration doped subregion closest to an interface between the vertical high concentration doped regions and a second vertical high concentration doped subregion farthest from the interface and respectively having first and second doping concentrations higher than those of the first and second type wells, and a third vertical high concentration doped subregion interposed between the first and second vertical high concentration doped subregions and having a third doping concentration lower than the first and second doping concentrations.

The breakdown voltage improving region may further include horizontal high concentration doped regions according to the first and second types horizontally in contact with at least portions of the upper surface of the substrate along lower edges of the first and second type wells, respectively, in portions where the first and second type wells and the substrate are in contact with each other.

The breakdown voltage improving region may further include edge high concentration doped regions according to the first and second types in contact with the entire upper surface of the substrate along the entire edges of the first and second type wells in portions where the first and second type wells and the substrate are in contact with each other.

The breakdown voltage improving region may include the vertical high concentration doped regions formed to overlap a portion within a specific thickness from the upper surface of the vertically contacted substrate.

The transistor may further include: an upper structure over-covering upper portions of the vertical high concentration doped regions, wherein the vertical high concentration doped regions according to the first and second types are formed to be vertically in contact from the upper surface of the substrate to a lower surface of the upper structure in portions where the first and second type wells between the substrate and the upper structure are in contact with each other.

The breakdown voltage improving region may have a width of 1.3 μm to 2.7 μm, and each of the vertical high concentration doped regions has a width of 0.75 μm to 1.25 μm.

The sum of widths of the first and second type wells may be 15 μm to 25 μm, and the breakdown voltage improving region has a width corresponding to 5% to 15% of the sum of the widths of the first and second type wells.

Each of the first and second type wells may be formed to have a doping concentration of $0.5 \times 10^{16}$ $cm^{-3}$ to $1.5 \times 10^{16}$ $cm^{-3}$, and the breakdown voltage improving region includes the vertical high concentration doped regions each formed to have a doping concentration of $2.0 \times 10^{17}$ $cm^{-3}$ to $3.0 \times 10^{17}$ $cm^{-3}$.

The vertical high concentration doped regions may be formed through sequential implant doping according to each type.

The breakdown voltage improving region may have a thickness of 400% to 600% of a thickness of the source and drain doping regions.

The breakdown voltage improving region may have a thickness of 1.5 μm to 2.5 μm.

In another embodiment, a transistor includes: a substrate; an upper structure; first and second type wells in contact with each other between the substrate and the upper structure; and a breakdown voltage improving region including vertical high concentration doped regions according to first and second types vertically in contact from an upper surface of the substrate to a lower surface of the upper structure in a portion where the first and second type wells are in contact with each other.

In another embodiment, a method for manufacturing a transistor, including: preparing a substrate; forming first and second type wells in contact with each other on the substrate; and forming a breakdown voltage improving region including vertical high concentration doped regions according to first and second types vertically in contact from upper surfaces of the first and second type wells to an upper surface of the substrate in a portion where the first and second type wells are in contact with each other.

The disclosed technique may have the following effects. It is to be understood, however, that a specific embodiment should include the entirety of the following effects or only the following effects so the scope of the disclosed technology should not to be construed as being limited thereto.

The silicon carbide-based transistor and the method for manufacturing the same according to an embodiment of the present invention may improve a breakdown voltage and decrease a leakage current by structurally preventing the occurrence of reach-through.

The silicon carbide-based transistor and the method for manufacturing the same according to an embodiment of the present invention may maintain switch characteristics, while enhancing a breakdown voltage, in consideration of both the breakdown voltage due to reach-through and an avalanche breakdown voltage through the vertical high concentration doped regions each having a different doping concentration.

The silicon carbide-based transistor and the method for manufacturing the same according to an embodiment of the present invention may ensure operation stability of a complementary metal-oxide semiconductor (CMOS) at high temperatures, while supporting a high breakdown voltage.

DETAILED DESCRIPTION

Description of the present invention is merely an embodiment for structural or functional explanation and thus the scope of the present invention should not be interpreted as being limited by embodiments described in the specification. That is, embodiments can be modified in various manners and have various forms and thus the scope of the present invention should be understood to include equivalents that can realize the technical ideas. In addition, the objectives and effects proposed in the present invention are not intended to be included in a specific embodiment or only the effects are not intended to be included therein and thus the scope of the present invention should not be understood to be limited thereby.

Meanwhile, the terms used in the present application should be understood as follows.

Terms such as "first" and "second" are used to distinguish one component from another component and the scope of the present invention is not limited by such terms. For example, a first element may be called a second element and the second element may be called the first element.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements. Further, other expressions for describing a relationship between elements, that is, "between", "directly between", "adjacent to", "directly adjacent to" and the like should be interpreted in the same manner.

An element described in the singular form is intended to include a plurality of elements unless the context clearly indicates otherwise. In addition, in the specification of the present invention, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

In the method invention, steps may be performed in different order from the described order unless the context clearly indicates otherwise. That is, steps may be performed in the same order as the described one, performed substantially simultaneously or performed in reverse order.

It is to be noted that most terms disclosed in the present invention correspond to general terms well known in the art. Terms defined in generally used dictionaries should be interpreted as being consistent with contextual meanings of related art and cannot be interpreted as having ideal or excessively formal meanings unless clearly defined in the present application.

Figure 1:
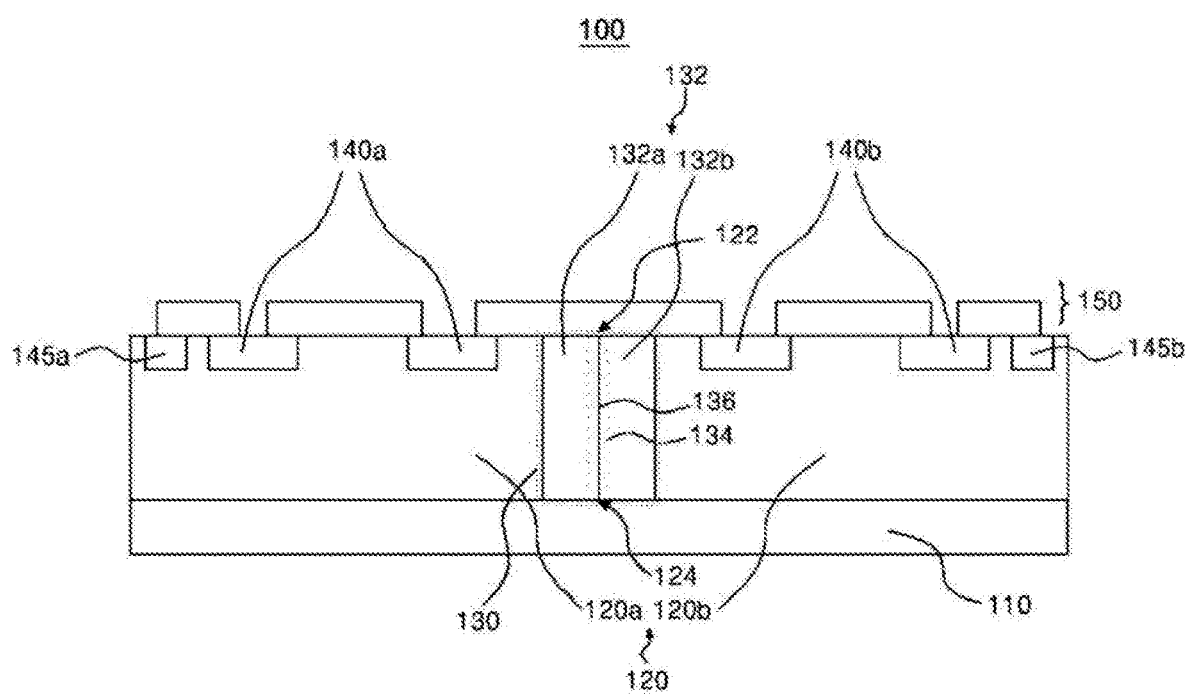
FIG. 1 is a cross-sectional view showing a structure of silicon carbide-based transistor according to an embodiment of the present invention.

FIG. 1 is a cross-sectional view showing a structure of silicon carbide-based transistor according to an embodiment of the present invention.

Referring to FIG. 1, a silicon carbide-based transistor (hereinafter, referred to as a transistor) 100 includes a substrate 110, first and second type wells 120, and a breakdown voltage improving region 130.

The substrate 110 corresponds to a semiconductor substrate. In an embodiment, the substrate 110 may correspond to a silicon carbide semiconductor substrate. For example, the substrate 110 may be formed of a silicon carbide single crystal layer having a 4H—SiC crystalline polymorphism and correspond to n-type wafer having a doped epi-layer. In another embodiment, the substrate 110 may be formed of a silicon single crystal layer and correspond to p-type wafer having a doped epi-layer.

Each of the first and second type wells 120 is formed at one end of the substrate 110 and corresponds to a sub-substrate having an opposite polarity each other. For example, the first type well 120a may correspond to a P-type well for forming NMOS and the second type well 120b may correspond to an N-type well for forming PMOS.

The first and second type wells 120 are in contact with each other on the substrate 110. In an embodiment, the first type well 120a may be formed of an N-type or P-type well through ion implantation at one end of the substrate 110, and the second type well 120b may be formed of a type of well different from the first type well 120a and may be in contact with a side surface of the first type well 120a to form an interface in a vertical direction. Here, the first and second type wells 120 may have the same width or different widths. In an embodiment, the first and second type wells 120 may be in contact with each other between the substrate 110 and an upper structure 150.

The breakdown voltage improving region 130 may be defined by vertical high concentration doped regions 132 according to each type in a portion where the first and second type wells 120 are contact with each other. More specifically, the breakdown voltage improving region 130 may include the vertical high concentration doped regions according to each type to extend from upper surfaces of the first and second type wells 120 to an upper surface of the substrate 110 in the portion where the first and second type wells 120 are in contact with each other. The breakdown voltage improving region 130 may include a vertical high concentration doped region 132a according to the first type formed at the edge of the first type well 120a and having a specific width and a high concentration doped region 132b according to the second type formed at the edge of the second type well 120b and having a specific width based on the portion where the first and second type wells 120 are in contact with each other. Here, the vertical high concentration doped regions 132 may use a dopant which is the same as that used in each of the first and second type wells 120 during formation through doping and may be doped with a doping concentration higher than that of each of the first and second type wells 120.

In an embodiment, each of the vertical high concentration doped regions 132 may be formed through implant doping. For example, each of the vertical high concentration doped regions 132 may be formed according to a process of implanting and depositing ions through ion implantation.

In an embodiment, the vertical high concentration doped regions 132 may be formed through sequential implant doping according to each type. For example, the vertical high concentration doped region 132a according to the first type may be formed first through the ion implantation, and thereafter, the vertical high concentration-doped region 132b according to the second type may be sequentially formed. In another embodiment, the vertical high concentration doped regions 132 may be formed through simultaneous implant doping according to each type. For example, the vertical high concentration doped region 132a according to the first type and second vertical high concentration doped region 132b according to the second type may be formed at the same time through ion implantation.

The breakdown voltage improving region 130 may include the vertical high concentration doped regions 132 formed vertically from a first surface 122 of the first and second type wells 120 to a second surface 124 thereof. That is, the breakdown voltage improving region 130 may include the vertical high concentration doped regions 132 respectively formed in the first type well 120a and second type well 120b, and each of the vertical high concentration doped regions 132 may be formed not to have a space (i.e., horizontal disconnection) therein. Thus, the breakdown voltage improving region 130 may suppress horizontal expansion of a depletion region causing reach-through, thus significantly enhancing a breakdown voltage.

The breakdown voltage improving region 130 may include a border region 134 at the portion where the first and second type wells are in contact with each other. Here, the border region 134 may be overlapped by the vertical high concentration-doped regions 132, may form an interface 136, or may be underlapped. More specifically, the border region 134 may be a region in which the vertical high concentration-doped regions 132 overlap by a specific width or smaller in the process of forming the vertical high concentration doped regions 132 through doping, may be a region in which the vertical high concentration doped regions 132 underlap with a gap interposed therebetween by a specific width or smaller to form an intrinsic region therein, or may form a single interface 136 without overlapping or underlapping.

The breakdown voltage improving region 130 may form the border region 134 having a certain allowable range of $\Delta W_{BS}$ defined as a percentage of the width of the border region 134 to the sum of the widths of the vertical high concentration doped regions 132. In an embodiment, $\Delta W_{BS}$ has an allowable range of $-5(\%) \leq \Delta W_{BS} (\%) \leq +7(\%)$. Here, a negative value indicates the overlapping and a positive value indicates the underlapping. More specifically, the breakdown voltage improving region 130 may have an allowable range of an asymmetric $\Delta W_{BS}$ in each of the overlapping and underlapping for the border region 134, and in each of the widths corresponding to the vertical high concentration doped regions 132.

In an embodiment, the breakdown voltage improving region 130 may include symmetrical vertical high concentration-doped regions 132. For example, in the breakdown voltage improving region 130, the vertical high concentration-doped regions 132 may have the same width. Accordingly, the breakdown voltage improving region 130 may simplify the manufacturing process, reduce a difference in parasitic capacitance, and prevent an avalanche breakdown voltage from being relatively reduced due to asymmetry of a depletion region.

In another embodiment, the breakdown voltage improving region 130 may include asymmetrical vertical high concentration doped regions 132. For example, when the widths of the depletion regions are different due to a difference in dopant and concentration in each of the first and second type wells 120 in the breakdown voltage improving region 130, the vertical high concentration doped regions 132 may have asymmetrical widths in consideration of the difference to improve the breakdown voltage due to reach-through and to maintain other switching characteristics.

In an embodiment, the breakdown voltage improving region 130 may include the vertical high concentration doped regions 132 such that a doping concentration decreases away from the border region 134 of the vertical high concentration doped regions 132. Accordingly, a phenomenon that an avalanche breakdown voltage is reduced due to a depletion region reduced due to the formation of the vertical high concentration doped regions 132 may be relieved and the switching characteristics may be maintained, while improving the overall breakdown voltage, through optimization of the breakdown voltage due to reach-through and the avalanche breakdown voltage.

In the breakdown voltage improving region 130, the vertical high concentration doped regions 132 may be formed to have a doping concentration higher than that of each of the first and second type wells 120 and lower than that of source and drain doped regions 140 formed in portions of each of the first and second type wells 120. For example, in the breakdown voltage improving region 130, horizontal expansion of the depletion region may be effectively limited through the vertical high concentration doped region 132a according to the first type which is doped with a doping concentration higher than that of the first type well 120a and doped with a doping concentration lower than that of the source and drain doped regions 140a, thus improving occurrence of breakdown due to reach-through.

In an embodiment, each of the first and second type wells 120 may be doped with a doping concentration of $0.5 \times 10^{16}$ cm$^{-3}$ to $1.5 \times 10^{16}$ cm$^{-3}$ and the vertical high concentration-doped regions 132 according to each type in the breakdown voltage improving region 130 may have a doping concentration of $2.0 \times 10^{17}$ cm$^{-3}$ to $3.0 \times 10^{17}$ cm$^{-3}$. Here, the source and drain doped regions 140 may have a doping concentration of $0.5 \times 10^{19}$ cm$^{-3}$ to $1.5 \times 10^{19}$ cm$^{-3}$. Preferably, the first and second type wells 120, the vertical high concentration doped regions 132, and the source and drain doped region 140 have average doping concentrations of $1.0 \times 10^{16}$ cm$^{-3}$, $2.5 \times 10^{17}$ cm$^{-3}$, and $0.5 \times 10^{19}$ cm$^{-3}$, respectively.

In an embodiment, the breakdown voltage improving region 130 may have a width of about 1.3 μm to 2.7 μm, and each of the vertical high concentration-doped regions 132 may have a width of 0.75 μm to 1.25 μm. Preferably, the breakdown voltage improving region 130, the vertical high concentration-doped region 132a according to the first type, and the vertical high concentration-doped region 132b according to the second type have widths of 2 μm, 1 μm, and 1 μm, respectively.

The breakdown voltage improving region 130 may have a width corresponding to a specific percentage of a cell pitch or the sum of the widths of the first and second type wells. In an embodiment, the sum of the widths of the first and second type wells 120 may be 15 μm to 25 μm, and the breakdown voltage improving region 130 may have a width corresponding to 5% to 15% of the sum of the widths of the first and second type wells 120.

The breakdown voltage improving region 130 may have a thickness corresponding to a specific percentage of a thickness of the source and drain doping regions 140. In an embodiment, the breakdown voltage improving region 130 may have a thickness of 400% to 600% of the thickness of the source and drain doping regions 140. For example, each of the source and drain doping regions 140 may have a thickness of 0.4 μm, and the breakdown voltage improving region 130 may have a thickness of 1.5 μm to 2.5 μm. Accordingly, by predicting horizontal and vertical extension of the depletion region from the source and drain doped regions 140 when a high voltage is applied, through a simulation, or the like, breakdown improvement due to reach-through and manufacturing cost may be traded off, based on which thicknesses of the breakdown voltage improving region 130 and the first and second type wells 120 may be designed and manufactured.

The transistor 100 may include the source and drain doped regions 140 and a latch-up prevention doped region 145 formed at an end of each of the first and second type wells 120. The source and drain doped regions 140 may be formed through ion implantation in accordance with a type having the opposite polarity for each type and may be used as a source and a drain when operated as a CMOS transistor.

The latch-up prevention doped region 145 may be formed through ion implantation in accordance with each type of the first or second type wells 120, and may be formed at one end of the first or second type well 120 to eliminate a bulk voltage to prevent latch-up.

The transistor 100 may further include the upper structure 150 over-covering upper portions of the vertical high concentration doped regions 132. The upper structure 150 may include a plurality of gate insulating films, gates, oxide films, and intermediate connecting metals.

Each of the gate insulating films may be formed on upper portions of each of the first and second type wells 120. The gate insulating films may serve as an electrical insulator formed of an insulating material (for example, $SiO_2$) having a high dielectric constant.

The gates may be formed on upper portions of the gate insulating films, respectively, and may form a channel and a depletion region in portions of the first and second type wells 120 through the gate insulating films when a voltage is applied from the outside. The gates may be insulated from the first or second type wells 120 including the source and drain doped regions 140 through the gate insulating films.

The oxide films, which are oxide layers used as insulating films, may be formed at upper portions between the first or second type wells 120 and may also be used to isolate elements during a process of manufacturing an integrated circuit, as well as serving as an electrical insulator.

Figure 2:
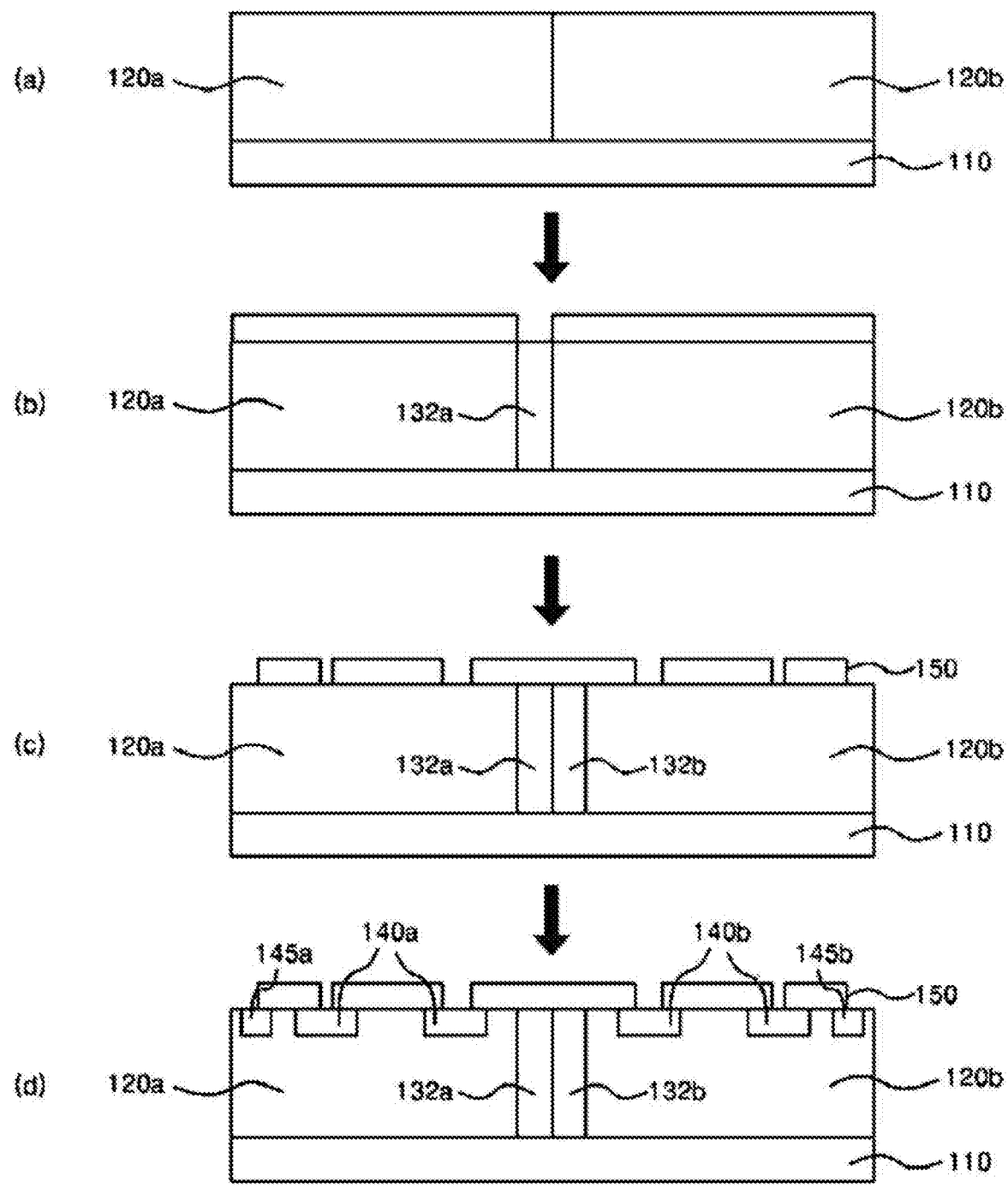
FIG. 2 is a view illustrating a sequential process of manufacturing a silicon carbide-based transistor of FIG. 1.

FIG. 2 is a view illustrating a sequential process of manufacturing the silicon carbide-based transistor of FIG. 1.

The first type well 120a and the second type well 120b of the transistor 100, which are in contact with each other, are formed on the substrate 110 (step (a)). In an embodiment, the P-type well 120a may be formed on the prepared silicon carbide substrate 110 through P-type implant doping and the N-type well 120b may be sequentially formed through N-type implant doping such that the N-type well 120b and the P-type well 120a are in contact with each other at side portions thereof. In an embodiment, the first and second type wells 120 may be formed through a spreading process, an ion implantation process, or an epitaxial growth process.

The vertical high concentration doped region 132a according to the first type is formed at a portion where the first and second type wells 120 are in contact each other in the transistor 100 (step (b)). More specifically, a patterning process may be performed on upper portions of the first and second type wells 120 using a hard mask to first form a patterning space for doping and the vertical high concentration doped region 132a according to the first type may be formed using implant doping. Accordingly, the vertical high concentration-doped region 132a according to the first type may be formed horizontally from one end of the first type well 120a to the portion where the first and second type wells 120 are in contact with each other and vertically from the first surface 122 of the first type well 120a to the second surface 124 thereof in the transistor 100.

The vertical high concentration doped region 132b according to the second type is formed at a portion where the first and second type wells 120 are in contact each other in the transistor 100 (step (c)). More specifically, a patterning process may be performed on upper portions of the first and second type wells 120 using a hard mask to again form a patterning space for doping, and the vertical high concentration doped region 132b according to the second type may be formed using implant doping such that the vertical high-concentration doped region 132b according to the second type is in contact with the vertical high concentration doped region 132a according to the first type.

The source and drain doped regions 140 and the latch-up prevention doped region 145 may be formed at one end of each of the first and second type wells 120 in the transistor 100 (step (d)). More specifically, the source and drain doped region 140a according to the second type having the opposite polarity to the first type may be formed through implant doping at one end of the first type well 120a and the latch-up prevention doped region 145b according to the first type may be formed at one end of the first type well 120a. Also, the source and drain doped region 140b according to the first type having the opposite polarity to the second type may sequentially be formed through the implant doping at one end of the second type well 120b and the latch-up prevention doped region 145a according to the second type may be formed at one end of the second type well 120b.

The upper structure 150 including at least one of a plurality of gate insulating films, gates, oxide films, and intermediate connecting metals may further formed at upper portions of the first and second type wells 120 and the vertical high concentration doped regions 132 in the transistor 100. For example, the gate insulating films may be deposited at upper portions of the first and second type wells 120, and the gates may be deposited at upper portions of the gate insulating films and may be planarized through a chemical mechanical polishing (CMP) process.

FIGS. 3A-3F show cross-sectional views illustrating other embodiments of a structure of the silicon carbide-based transistor of FIG. 1.

Figure 3A:
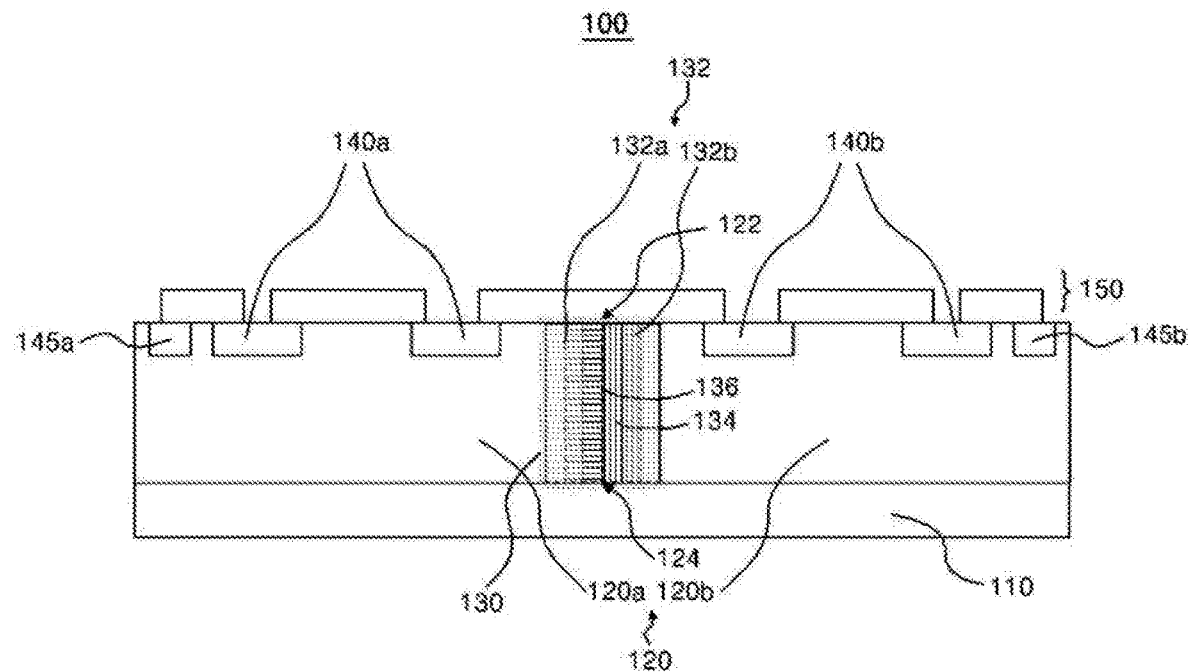
FIGS. 3A-3F show cross-sectional views illustrating other embodiments of a structure of the silicon carbide-based transistor of FIG. 1.
Figure 3B:
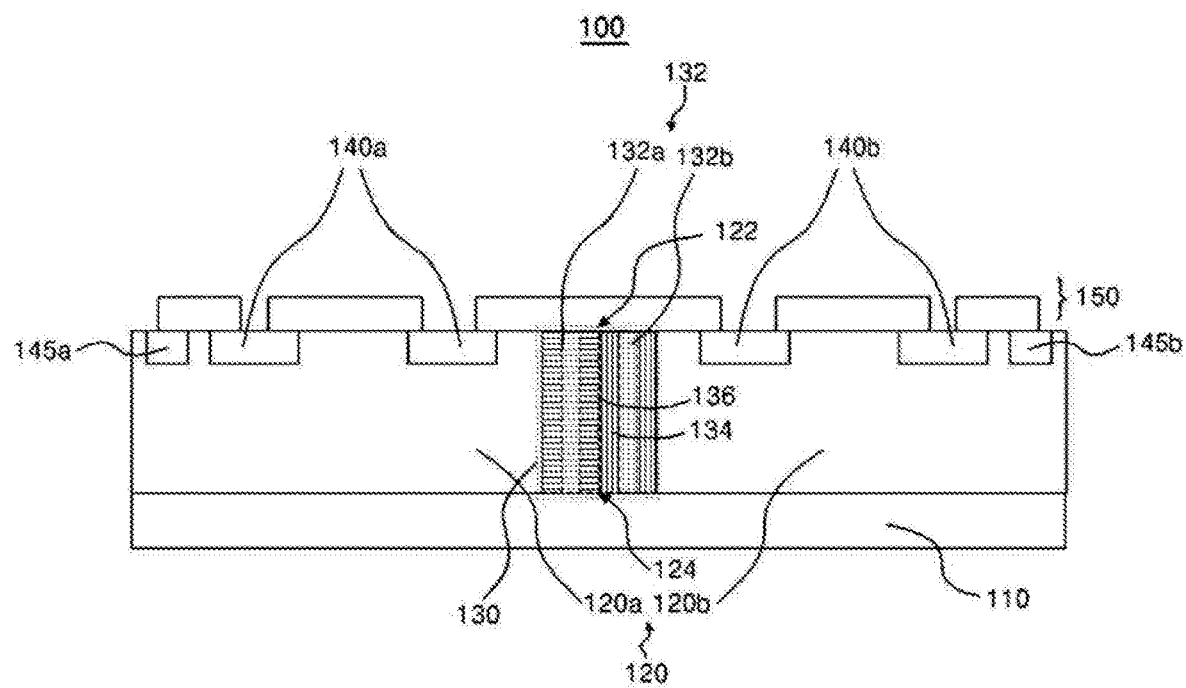

FIG. 3A or 3B shows embodiments in which the breakdown voltage improving region of FIG. 1 includes a plurality of vertical high concentration doped subregions.

In FIGS. 3A to 3B, the breakdown voltage improving region 130 has the vertical high concentration doped regions 132 according to each type, and each of the vertical high concentration doped regions 132 may include a plurality of vertical high concentration doped subregions, each having a different doping concentration.

In the FIG. 3A, each of the vertical high concentration doped regions 132 may include a plurality of vertical high concentration doped subregions having a doping concentrations decreased away from the interface 136 between the vertical high concentration doped regions 132. For example, the vertical high concentration doped region 132a according to the first type may have three vertical high concentration doped subregions, and a first vertical high concentration doped subregion closest to the interface 136 between the vertical high concentration-doped regions 132 may have a doping concentration of $2.5 \times 10^{17}$ $cm^{-3}$ to $3.0 \times 10^{17}$ $cm^{-3}$, a second vertical high concentration doped subregion farther than the first vertical high concentration doped subregion may have a doping concentration of $2.0 \times 10^{17}$ $cm^{-3}$ to $2.5 \times 10^{17}$ $cm^{-3}$ which is lower than the first vertical high concentration doped subregion, and a third vertical high concentration doped sub region farther than the second vertical high concentration doped sub-region may have a doping concentration of $1.5 \times 10^{17}$ $cm^{-3}$ to $2.0 \times 10^{17}$ $cm^{-3}$ which is lower than the second vertical high concentration doped subregion but higher than the first type well 120a.

In the FIG. 3B, each of the vertical high concentration doped regions 132 may have a first vertical high concentration doped subregion closest to the interface 136 between the vertical high concentration doped regions 132 and a second vertical high concentration doped subregion, respectively, having first and second doping concentrations higher than the corresponding type wells, and a third vertical high concentration doped subregion interposed between the first and second vertical high concentration doped subregions having a third doping concentration lower than the first and second doping concentrations. For example, the vertical high concentration doped region 132b may have three vertical high concentration doped subregions, the first vertical high concentration doped subregion closest to the interface 136 between the vertical high concentration doped regions 132 and the second vertical high concentration doped subregion farthest therefrom may have doping concentrations of $2.5 \times 10^{17}$ cm$^{-3}$ to $3.0 \times 10^{17}$ cm$^{-3}$ and $2.0 \times 10^{17}$ cm$^{-3}$ to $2.5 \times 10^{17}$ cm$^{-3}$, respectively, and a third vertical high concentration doped subregion interposed between the first and second vertical high concentration doped subregions may have a doping concentration of $1.5 \times 10^{17}$ cm$^{-3}$ to $2.0 \times 10^{17}$ cm$^{-3}$ which is lower than those of the first and second vertical high concentration doped subregions but higher than that of the second type well 120b.

Figure 3C:
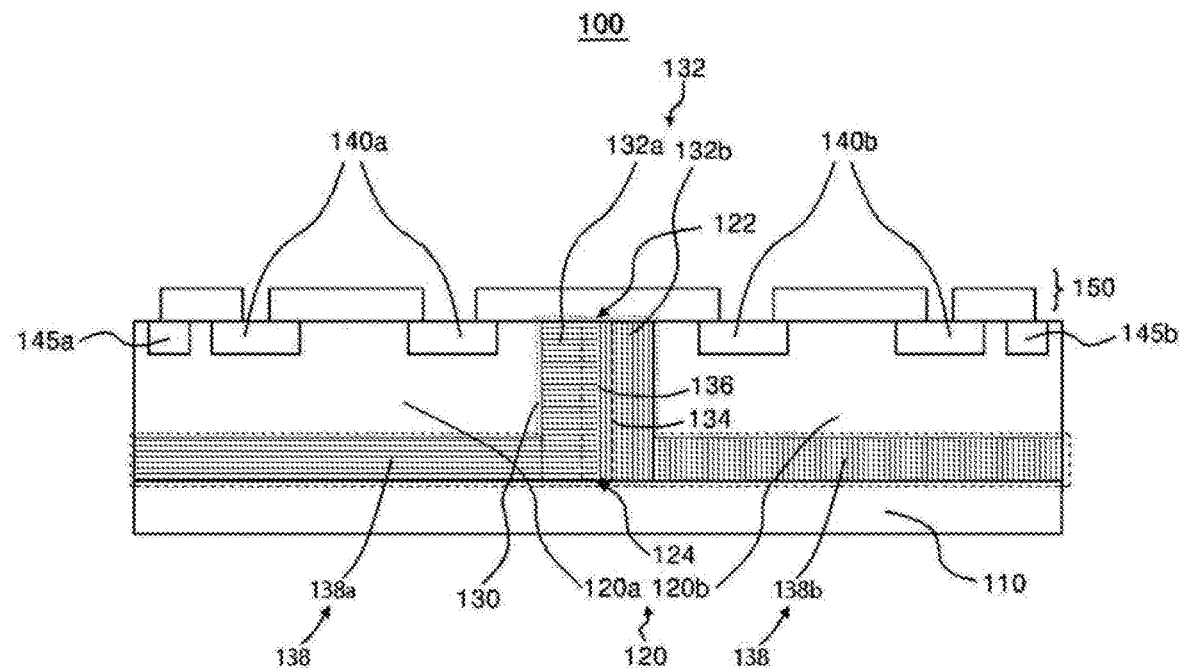
Figure 3D:
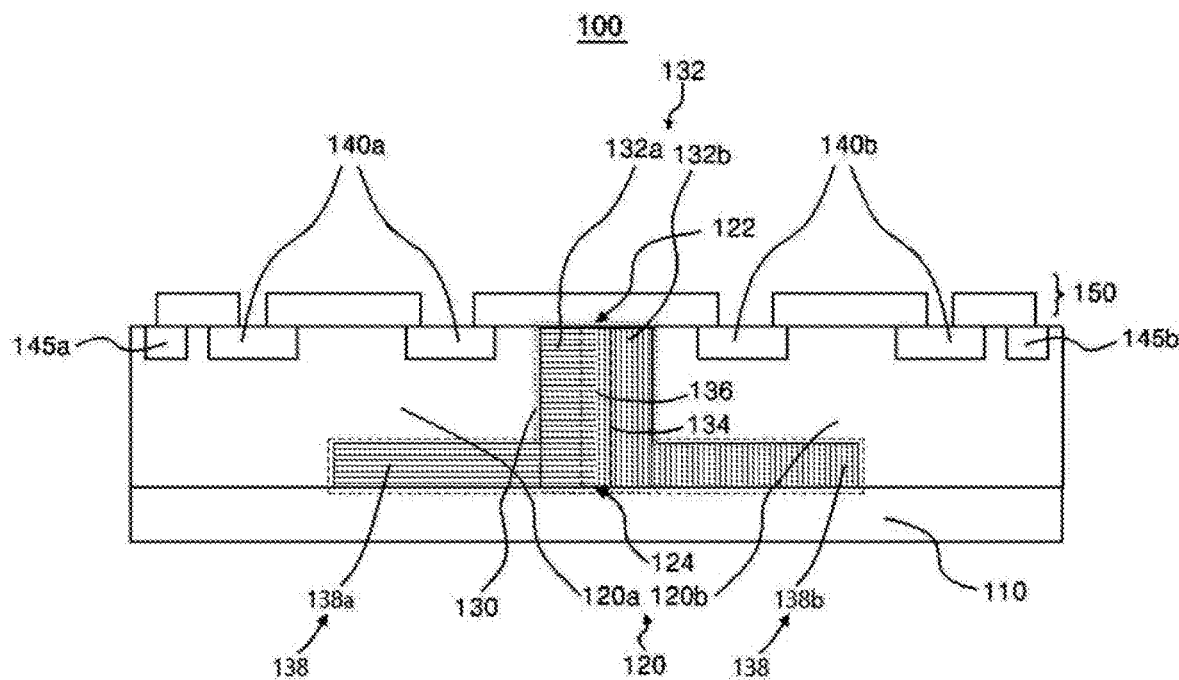

FIGS. 3C to 3D illustrates embodiments in which the breakdown voltage improving regions of FIG. 1 includes horizontal high concentration doped regions or edge high concentration doped regions.

In FIGS. 3C and 3D, the breakdown voltage improving region 130 may further include horizontal high concentration doped regions 138 according to each type along lower edges of the first and second type wells 120 from a portion where the first and second type wells 120 and the substrate 110 are in contact with each other so as to be horizontally in contact with at least a portion of an upper surface of the substrate 110.

In FIG. 3C, the horizontal high concentration doped regions 138 may be formed in a horizontal direction so as to be in contact with the entire upper surface of the substrate 110 in the regions of the first and second type wells excluding the regions where the vertical high concentration doped regions 132 according to each type and the upper portions of the substrate 110 are in contact with each other.

In FIG. 3D, the horizontal high concentration doped regions 138 may be formed in a horizontal direction so as to be in contact with upper portions of the substrate 110 within a predetermined specific width from regions which are in contact with the vertical high concentration-doped regions according to each type in regions of the first and second type wells excluding regions in which the vertical high concentration doped regions 132 according to each type and the upper portions of the substrate 110 are in contact with each other. For example, the horizontal high concentration doped regions 138a according to the first type may be formed to be in contact with the upper portions of the substrate 110, starting from the portion in which the vertical high concentration doped region 132a according to the first type and the substrate are in contact with each other, to have a width of 3.0 μm to 4.0 μm larger than the width of the breakdown voltage improving region 130.

Figure 3E:
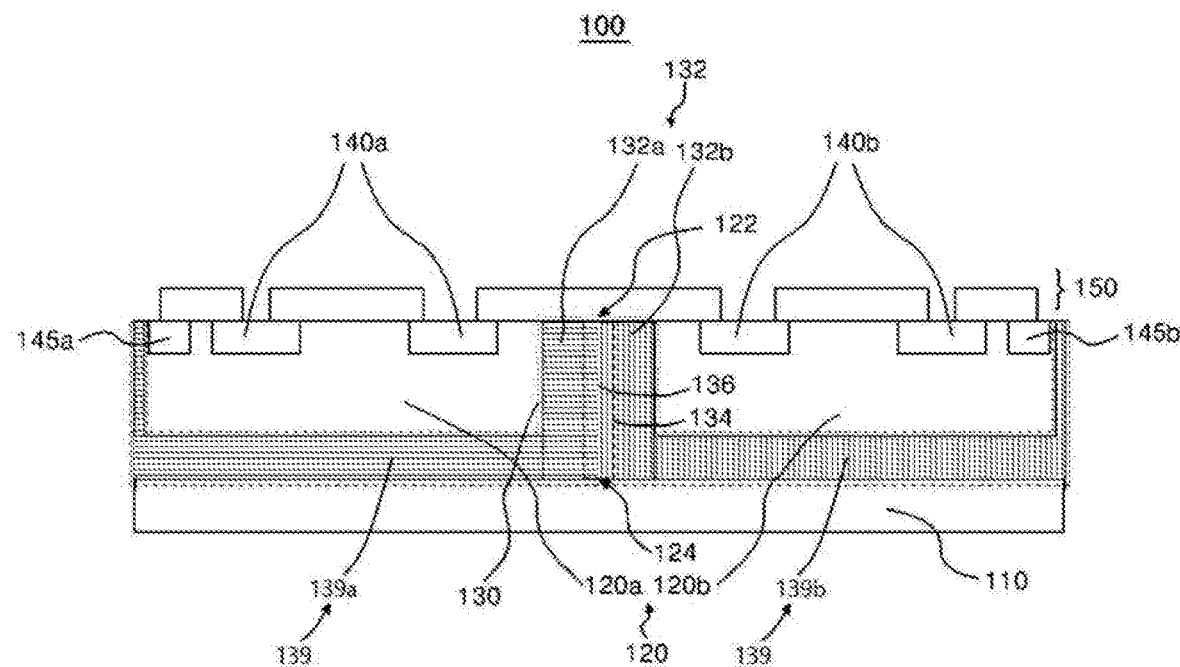

In FIG. 3E, the breakdown voltage improving region 130 may further include edge high concentration doped regions 139 according to each type in contact with the entire upper surface of the substrate 110 along the entire edges of the first or second type well 120a or 120b from the portion where the first or second type well 120a or 120b and substrate 110 are in contact with each other. For example, a first type edge high concentration doped region 139a is formed along the edge of the first type well 120a so that the first type well 120a and the substrate 110 may be connected to each other through the edge high concentration doped region 139a according to the first type.

In the above embodiments, the horizontal high concentration doped regions 138 according to each type or the edge high concentration doped regions 139 according to each type may be formed to be in horizontally contact with the upper portions of the substrate 110 and have a specific width through an ion implantation process in which an energy level for ion implantation is adjusted after the vertical high concentration doped regions 132 according to each type are formed.

Figure 3F:
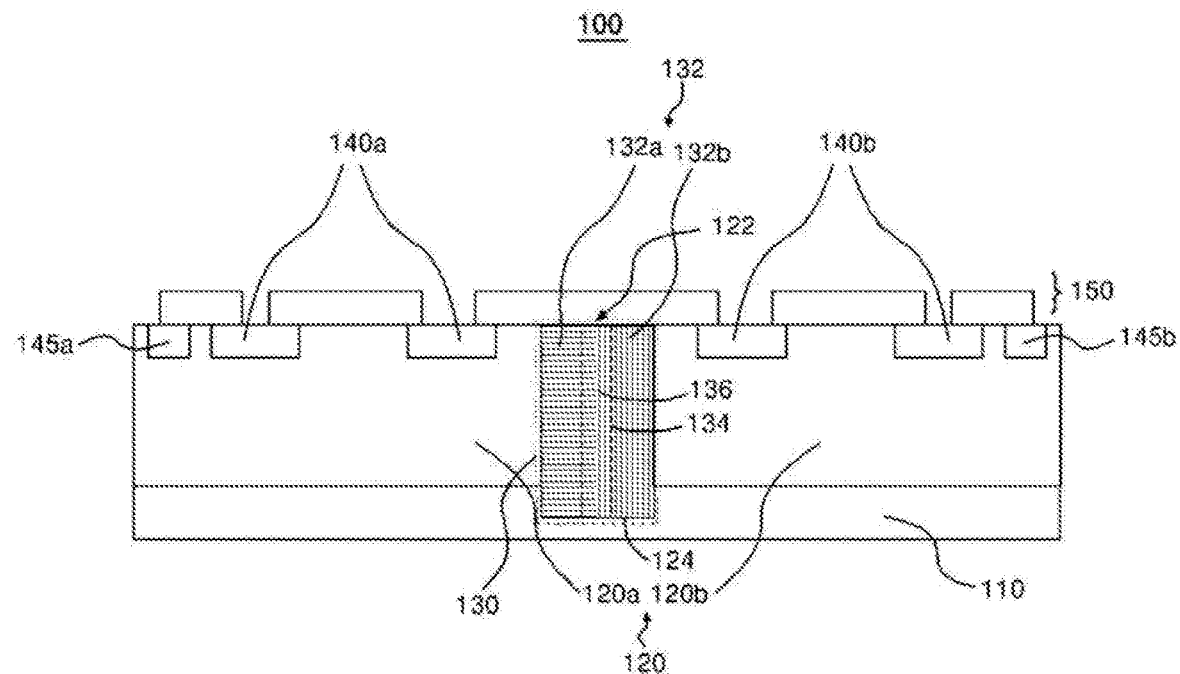

FIG. 3F shows an embodiment in which the breakdown voltage improving region of FIG. 1 includes vertical high concentration doped regions overlapping the substrate.

In FIG. 3F, the breakdown voltage improving region 130 may include the vertical high concentration doped regions 132 overlapping a portion within a specific thickness from the upper surface of the vertically contacted substrate 110. For example, the vertical high concentration doped regions 132 according to each type may overlap by 2.0 μm to 3.0 μm deeper than depths of the wells according to corresponding types, and the vertical high concentration doped regions 132a and 132b may be symmetrical.

Figure 4A:
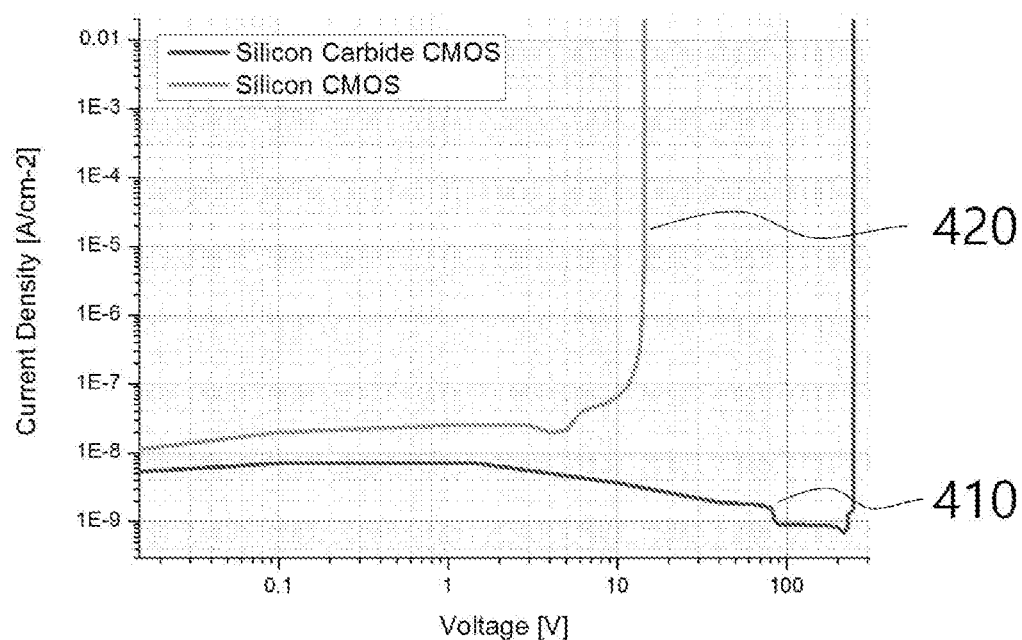
FIGS. 4A and 4B are simulation graphs showing a difference between a silicon carbide-based transistor according to an embodiment of the present invention and the related art transistor.
Figure 4B:
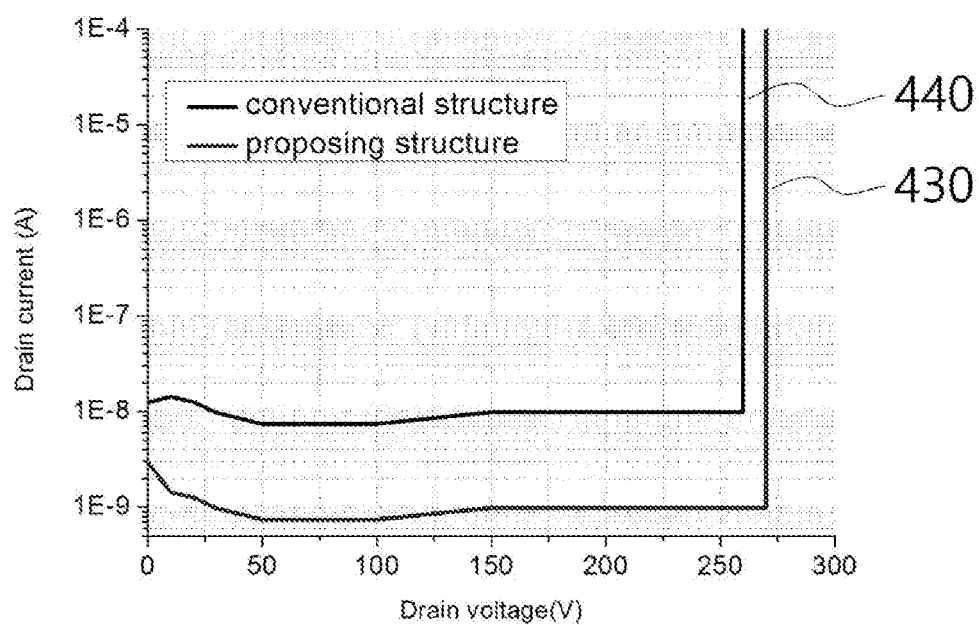

FIGS. 4A and 4B are simulation graphs showing a difference between a silicon carbide-based transistor according to an embodiment of the present invention and the related art transistor.

FIG. 4A shows simulation results for breakdown voltages of the transistor 100 realized as a CMOS transistor through silicon carbide and having the improved breakdown voltage improving region 130 and a first transistor of the related art realized as a CMOS transistor through silicon.

In FIG. 4A, a first simulation graph 410 shows a simulation result regarding the transistor 100 according to an embodiment of the present invention having a breakdown voltage of 260 V and a second simulation graph 420 shows a simulation result regarding the first transistor having a breakdown voltage of 13 V. As a result, the transistor 100 has a breakdown voltage significantly improved by structurally preventing a reach-through phenomenon that occurs in a well region of the device.

FIG. 4B shows simulation results for the transistor 100 including the breakdown voltage improving region 130 in vertically contact with the substrate 110, and a breakdown voltage of a second transistor of the related art in which a high concentration doped region is formed only in a portion of a well region.

In FIG. 4B, a third simulation graph 430 shows a simulation result regarding the transistor 100 according to an embodiment of the present invention, and a fourth simulation graph 440 shows a simulation result regarding the second transistor. Here, the corresponding simulation graphs are the results of simulations implemented using Synopsys' TCAD simulation tool, and a model of a material used in the simulations was 4H—SiC model which is generally used. Here, the other conditions (n+thickness, p+thickness, high doping region width, drift layer thickness, etc.) except for the breakdown voltage improving region were set to the same values.

In FIG. 4B, the third simulation graph 430 regarding the transistor 100 indicates that the breakdown voltage was improved by about 10 V and a leakage current was reduced to about $\frac{1}{10}$, as compared to the fourth simulation graph 440 regarding the second transistor. These results show a significant difference of effects on both the breakdown voltage and leakage current.

In an embodiment, the transistor 100 may significantly reduce the leakage current, as a factor significantly affects loss of stand-by power of the CMOS transistor, and improve the breakdown voltage at the same time.

In an embodiment, the transistor 100 may significantly improve the breakdown voltage by completely preventing the reach-through phenomenon that occurs in the well region of the device and significantly reduce a leakage current that occurs in the well region having a relatively low doping concentration.

Therefore, the technical scope of the present invention should not be confined to that provided by the embodiments, and it should be noted that not only the appended claims but also all of those equivalents to the appended claims or modifications which may be regarded as being equal thereto belong to the technical scope of the present invention.

What is claimed is:

1. A transistor comprising:
   a substrate:
   first and second type wells in contact with each other on the substrate; and
   a breakdown voltage improving region including vertical high concentration doped regions according to first and second types vertically in contact from upper surfaces of the first and second type wells to an upper surface of the substrate in a portion where the first and second type wells are in contact with each other,
   wherein each of the vertical high concentration doped regions includes a plurality of vertical high concentration doped subregions, each having a different doping concentration, and
   wherein each of the vertical high concentration doped regions includes a first vertical high concentration doped subregion closest to an interface between the vertical high concentration doped regions and a second vertical high concentration doped subregion farthest from the interface and respectively having first and second doping concentrations higher than those of the first and second type wells, and a third vertical high concentration doped subregion interposed between the first and second vertical high concentration doped subregions and having a third doping concentration lower than the first and second doping concentrations.

2. The transistor of claim 1, wherein the breakdown voltage improving region includes a border region at the mutually contact region, and the border region is overlapped by the vertical high concentration doped regions according to the first and second types, forms an interface, or is underlapped.

3. The transistor of claim 2, wherein the border region of the breakdown voltage improving region is formed such that ΔWBS defined as a percentage of a width of the border region to the sum of widths of the vertical high concentration doped regions has an allowable range of −5(%)≤ΔWBS (%)≤+7(%), wherein the negative value indicates the overlapping and the positive value indicates the underlapping.

4. The transistor of claim 1, wherein the vertical high concentration doped regions of the breakdown voltage improving region are formed to be symmetrical.

5. The transistor of claim 1, wherein the vertical high concentration doped regions of the breakdown voltage improving region have a doping concentration higher than a doping concentration of each of the first and second type wells and lower than a doping concentration of source and drain doped regions formed in portions of each of the first and second type wells.

6. The transistor of claim 1, wherein the breakdown voltage improving region further includes horizontal high concentration doped regions according to the first and second types horizontally in contact with at least portions of the upper surface of the substrate along lower edges of the first and second type wells, respectively, in portions where the first and second type wells and the substrate are in contact with each other.

7. The transistor of claim 1, wherein the breakdown voltage improving region further includes edge high concentration doped regions according to the first and second types in contact with the entire upper surface of the substrate along the entire edges of the first and second type wells in portions where the first and second type wells and the substrate are in contact with each other.

8. The transistor of claim 1, wherein the breakdown voltage improving region includes the vertical high concentration doped regions formed to overlap a portion within a specific thickness from the upper surface of the vertically contacted substrate.

9. The transistor of claim 1, further comprising:
   an upper structure over-covering upper portions of the vertical high concentration doped regions,
   wherein the vertical high concentration doped regions according to the first and second types are formed to be vertically in contact from the upper surface of the substrate to a lower surface of the upper structure in portions where the first and second type wells between the substrate and the upper structure are in contact with each other.

10. The transistor of claim 1, wherein the breakdown voltage improving region has a width of 1.3 μm to 2.7 μm, and each of the vertical high concentration doped regions has a width of 0.75 μm to 1.25 μm.

11. The transistor of claim 1, wherein the sum of widths of the first and second type wells is 15 μm to 25 μm, and the breakdown voltage improving region has a width corresponding to 5% to 15% of the sum of the widths of the first and second type wells.

12. The transistor of claim 1, wherein each of the first and second type wells is formed to have a doping concentration of $0.5 \times 10^{16}$ cm$^{-3}$ to $1.5 \times 10^{16}$ cm$^{-3}$, and
   the breakdown voltage improving region includes the vertical high concentration doped regions each formed to have a doping concentration of $2.0 \times 10^{17}$ cm$^{-3}$ to $3.0 \times 10^{17}$ cm$^{-3}$.

13. The transistor of claim 1, wherein the vertical high concentration doped regions are formed through sequential implant doping according to each type.

14. The transistor of claim 1, wherein the breakdown voltage improving region has a thickness of 400% to 600% of a thickness of the source and drain doping regions.

15. The transistor of claim 1, wherein the breakdown voltage improving region has a thickness of 1.5 μm to 2.5 μm.

16. A transistor comprising;
    a substrate;
    an upper structure;
    first and second type wells in contact with each other between the substrate and the upper structure; and
    a breakdown voltage improving region including vertical high concentration doped regions according to first and second types vertically in contact from an upper surface of the substrate to a lower surface of the upper structure in a portion where the first and second type wells are in contact with each other,
    wherein each of the vertical high concentration doped regions includes a plurality of vertical high concentration doped subregions, each having a different doping concentration, and
    wherein each of the vertical high concentration doped regions includes a first vertical high concentration doped subregion closest to an interface between the vertical high concentration doped regions and a second vertical high concentration doped subregion farthest from the interface and respectively having first and second doping concentrations higher than those of the first and second type wells, and a third vertical high concentration doped subregion interposed between the first and second vertical high concentration doped subregions and having a third doping concentration lower than the first and second doping concentrations.

* * * * *